US006661863B1

(12) United States Patent
Toosky

(10) Patent No.: US 6,661,863 B1
(45) Date of Patent: Dec. 9, 2003

(54) PHASE MIXER

(75) Inventor: Zabih Toosky, Santa Cruz, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/407,017

(22) Filed: Sep. 28, 1999

Related U.S. Application Data

(60) Provisional application No. 60/129,697, filed on Apr. 16, 1999.

(51) Int. Cl.$^7$ .................................................. H03D 3/24
(52) U.S. Cl. ...................................................... 375/376
(58) Field of Search ................................ 375/376, 373, 375/327, 294; 327/156, 147, 152, 149, 158, 161, 160, 153, 151; 329/325; 331/25, 57

(56) References Cited

U.S. PATENT DOCUMENTS

| | | | | |
|---|---|---|---|---|
| 4,668,923 A | | 5/1987 | Lofter ........................... 331/16 |
| 4,802,009 A | | 1/1989 | Hartmeier .................... 358/158 |
| 5,022,056 A | * | 6/1991 | Henderson et al. ......... 327/141 |
| 5,052,031 A | | 9/1991 | Molloy ......................... 375/120 |
| 5,059,924 A | | 10/1991 | JenningsCheck ............. 331/1 A |
| 5,077,529 A | | 12/1991 | Ghoshal ....................... 328/155 |
| 5,442,664 A | * | 8/1995 | Rust et al. ................... 370/518 |
| 5,448,193 A | * | 9/1995 | Baumert et al. ............. 327/155 |
| 5,561,577 A | | 10/1996 | Motley ......................... 361/56 |
| 5,731,743 A | | 3/1998 | Sauer ........................... 331/57 |
| 5,818,365 A | * | 10/1998 | Hush et al. .................. 341/100 |
| 5,889,436 A | | 3/1999 | Yeung et al. .................... 331/2 |
| 6,356,123 B1 | * | 3/2002 | Lee et al. .................... 327/115 |

FOREIGN PATENT DOCUMENTS

GB   2 325 803   12/1998   ............ H03K/5/00

OTHER PUBLICATIONS

Copy of European Search Report for EP Appln. No. 00 106480.7; date search was completed: Jun. 23, 2000.

\* cited by examiner

Primary Examiner—Khai Tran
(74) Attorney, Agent, or Firm—Fish & Richardson P.C.

(57) ABSTRACT

A phase mixer is provided which locks a signal to a non-integer multiple of a reference signal. A phase mixer according to the present invention is provided which generates non-integer multiples of a stable reference source, such that an output frequency to an input frequency of the phase mixer has a frequency ratio of $$f_{out} = f_{in} \times \frac{N}{N \pm M},$$

where N is an integer number of phases of the reference signal and M is an integer less than N and the "+" operation is used when selecting phases in ascending order and the "−" operation is used when selecting phases in descending order. Briefly, the phase mixer according to one embodiment includes a recirculating shift register (108) and a multiplexer (110). The shift register (108) output addresses the multiplexer (110), and the multiplexer (110) in turn selects as the output one of the phases of the reference oscillator. The output of the multiplexer (110) is used to clock the shift register (108). Because the reference oscillator phases are themselves shifted with reference to one another, sequential selection of the phase pulses as output pulses results in an output which is a non-integer multiple of the reference oscillator frequency.

7 Claims, 8 Drawing Sheets

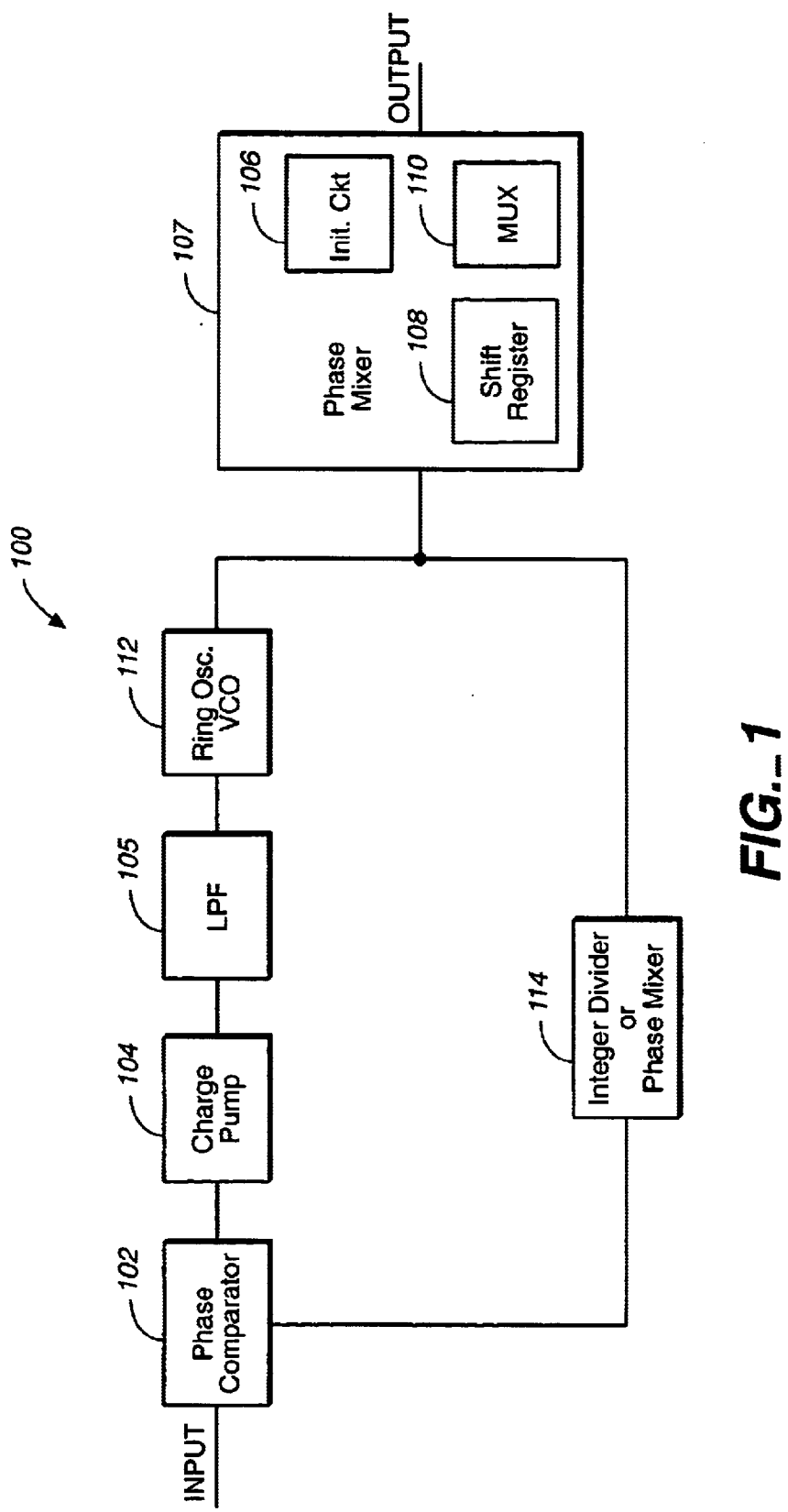
FIG._1

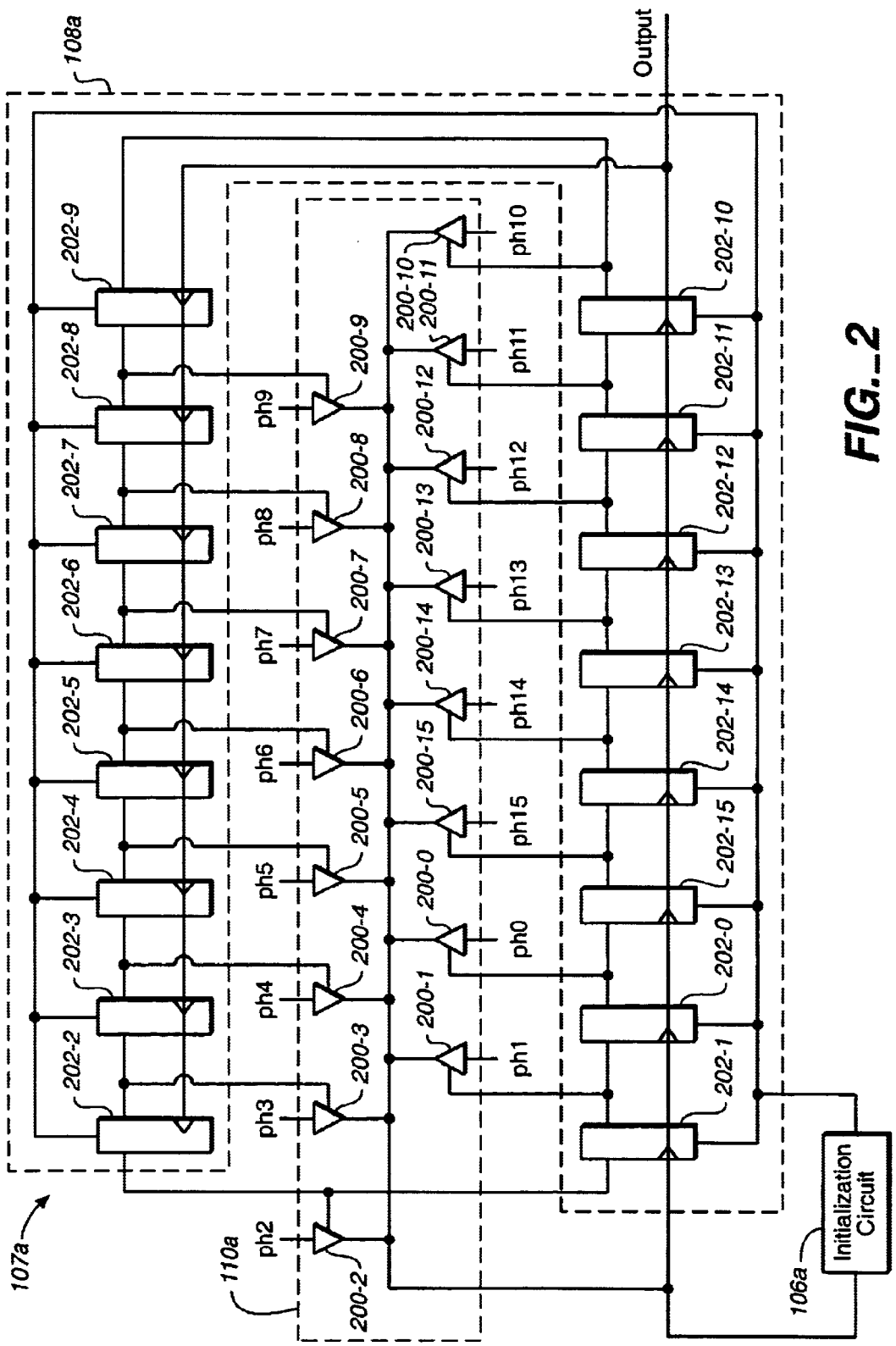
FIG._2

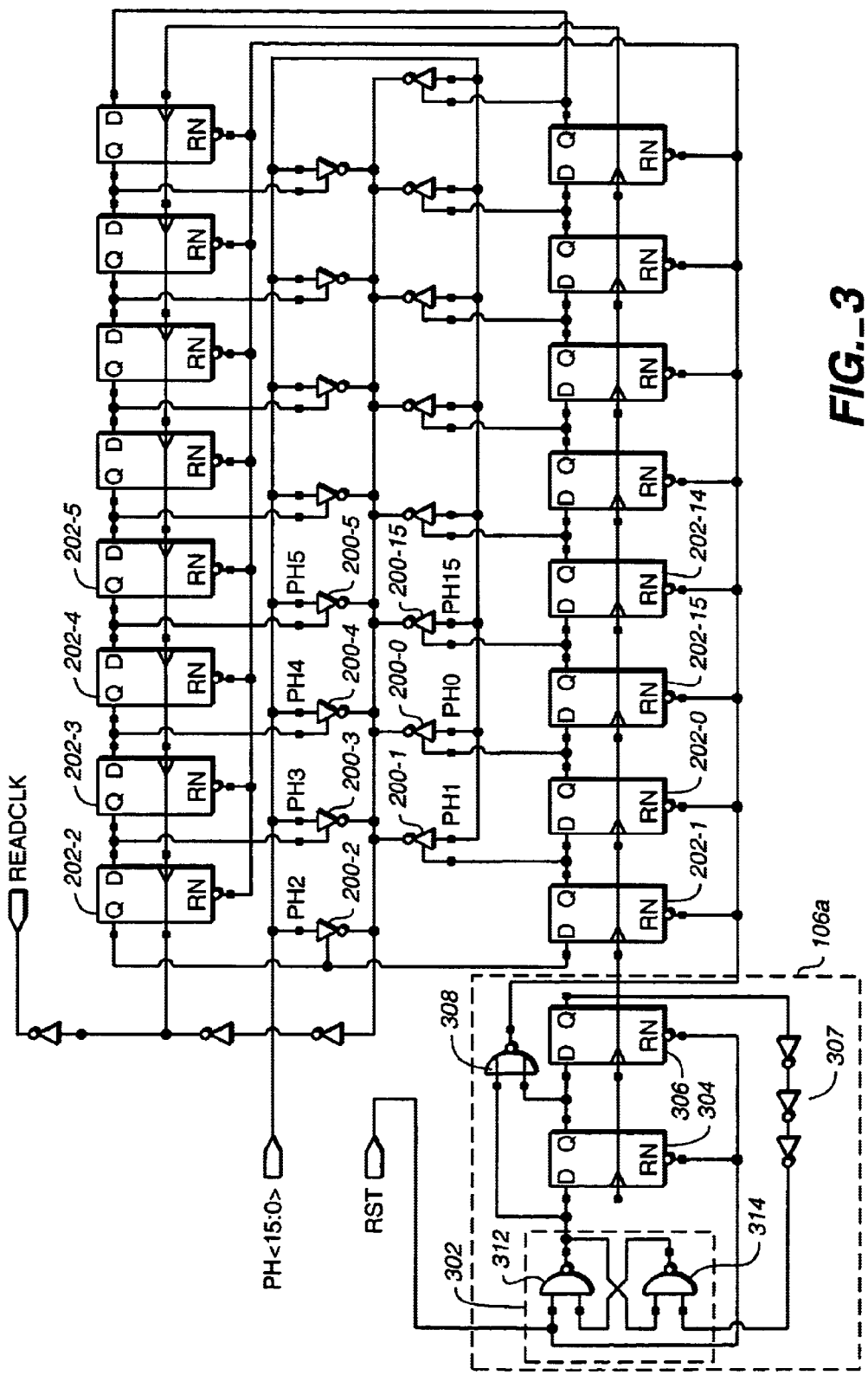
FIG._3

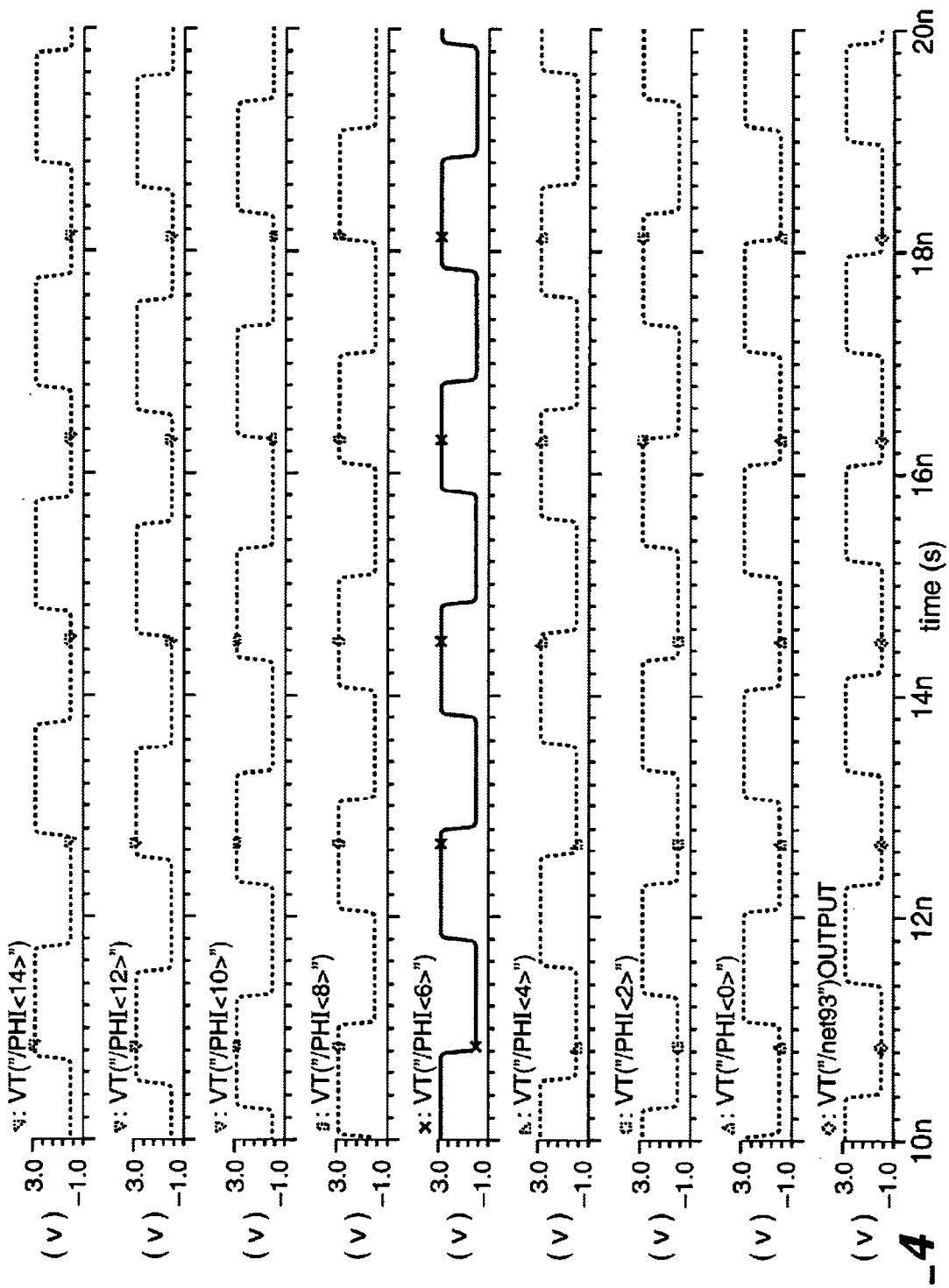
FIG._4

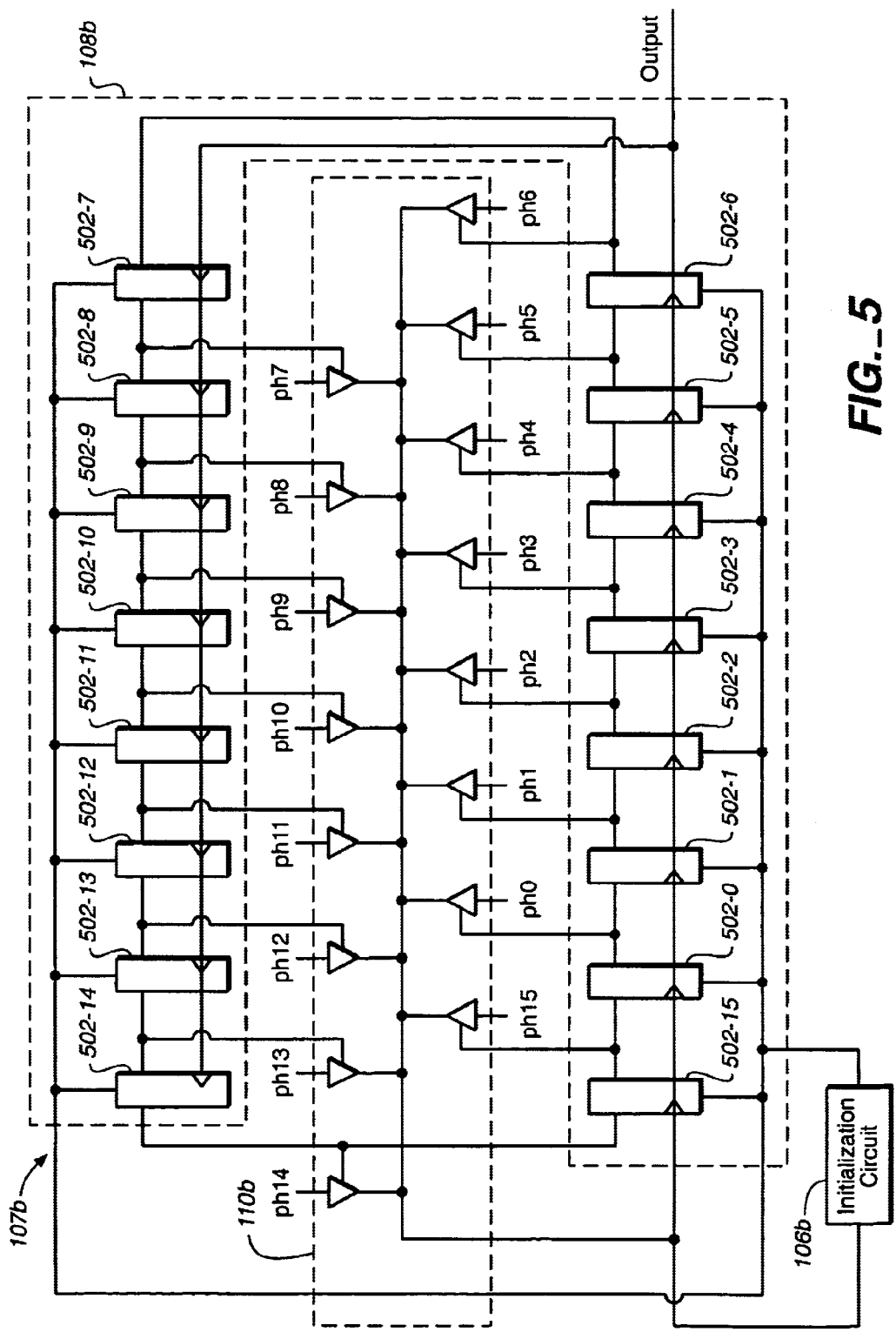
FIG._5

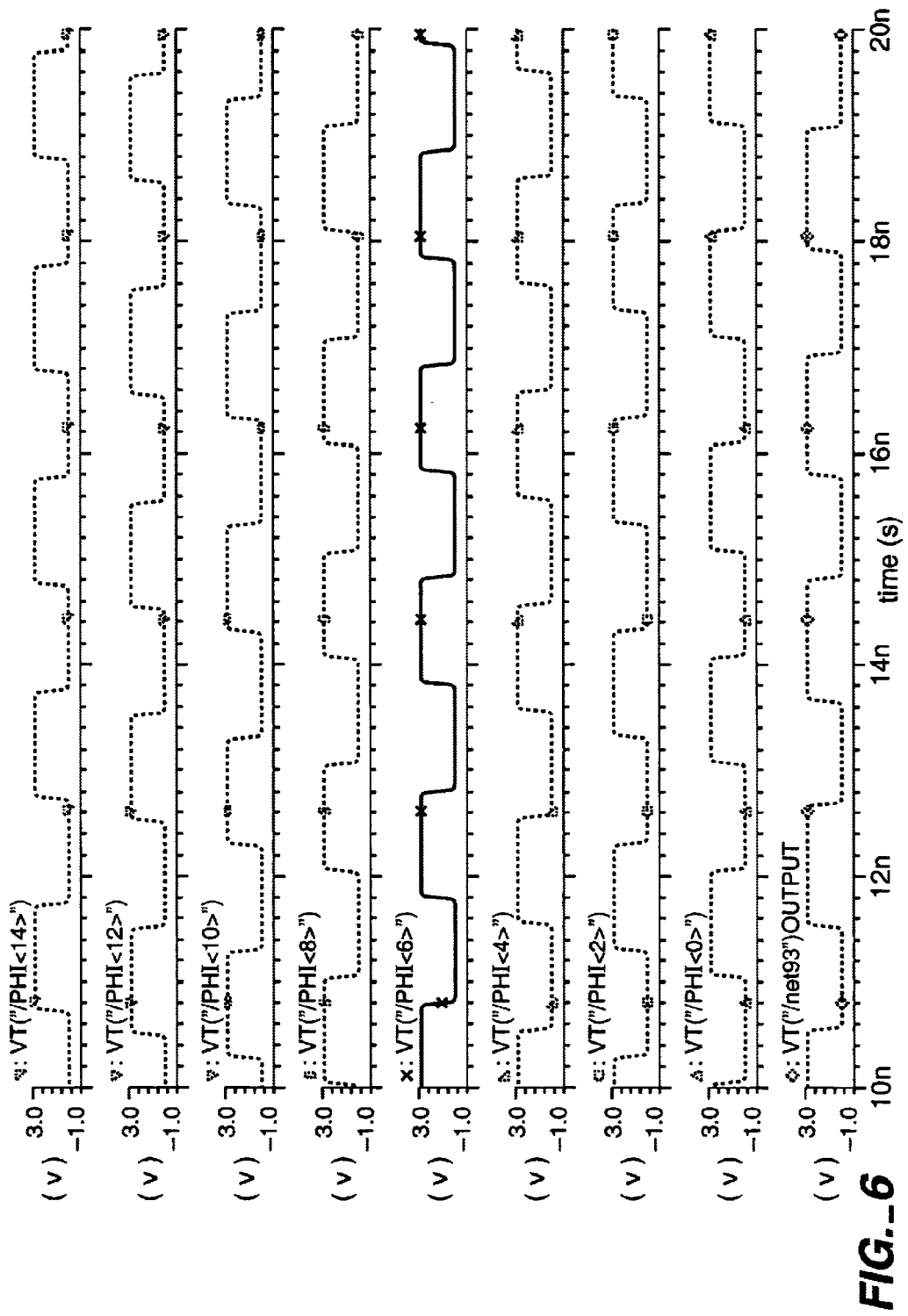
FIG._6

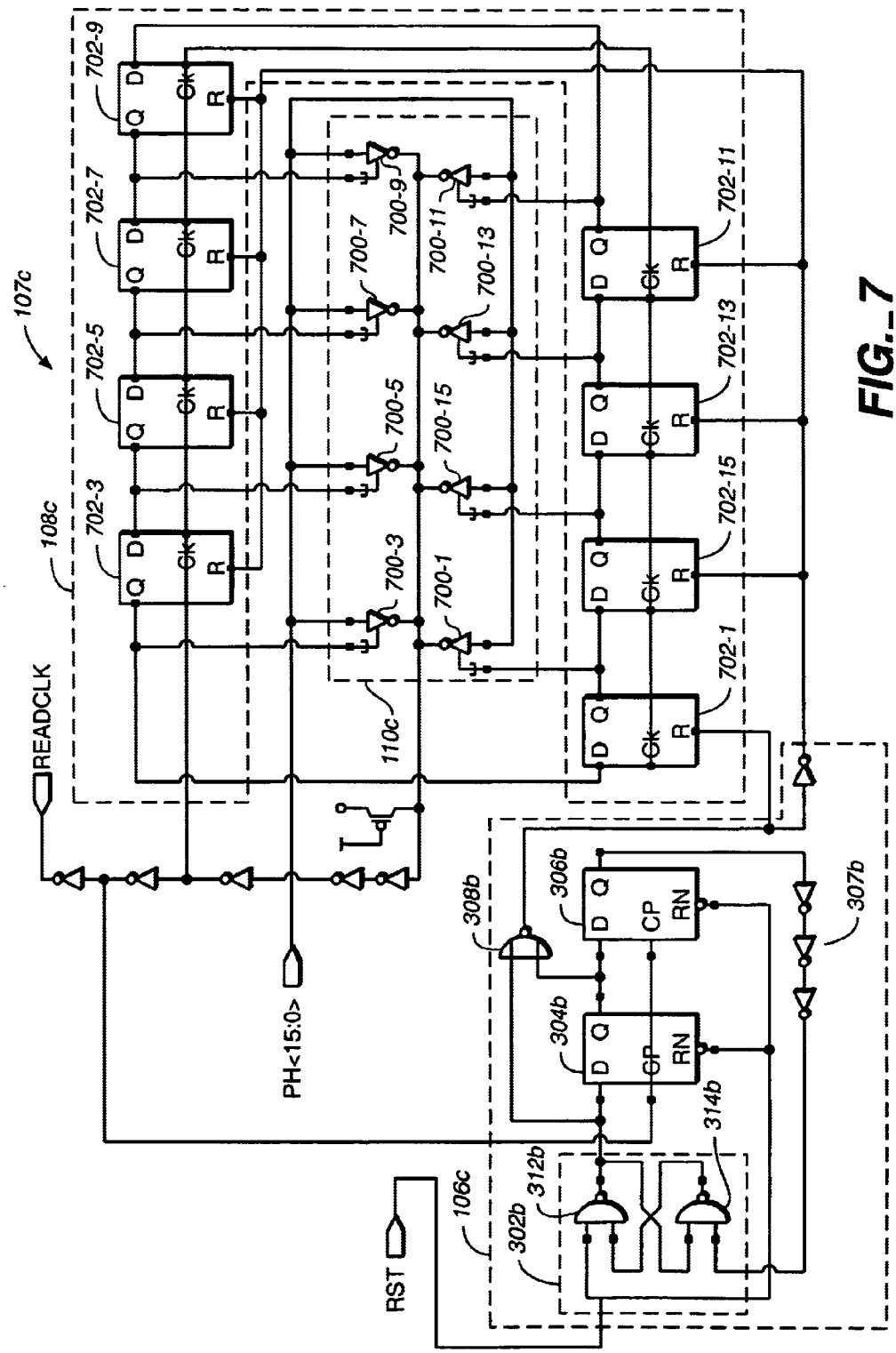
FIG._7

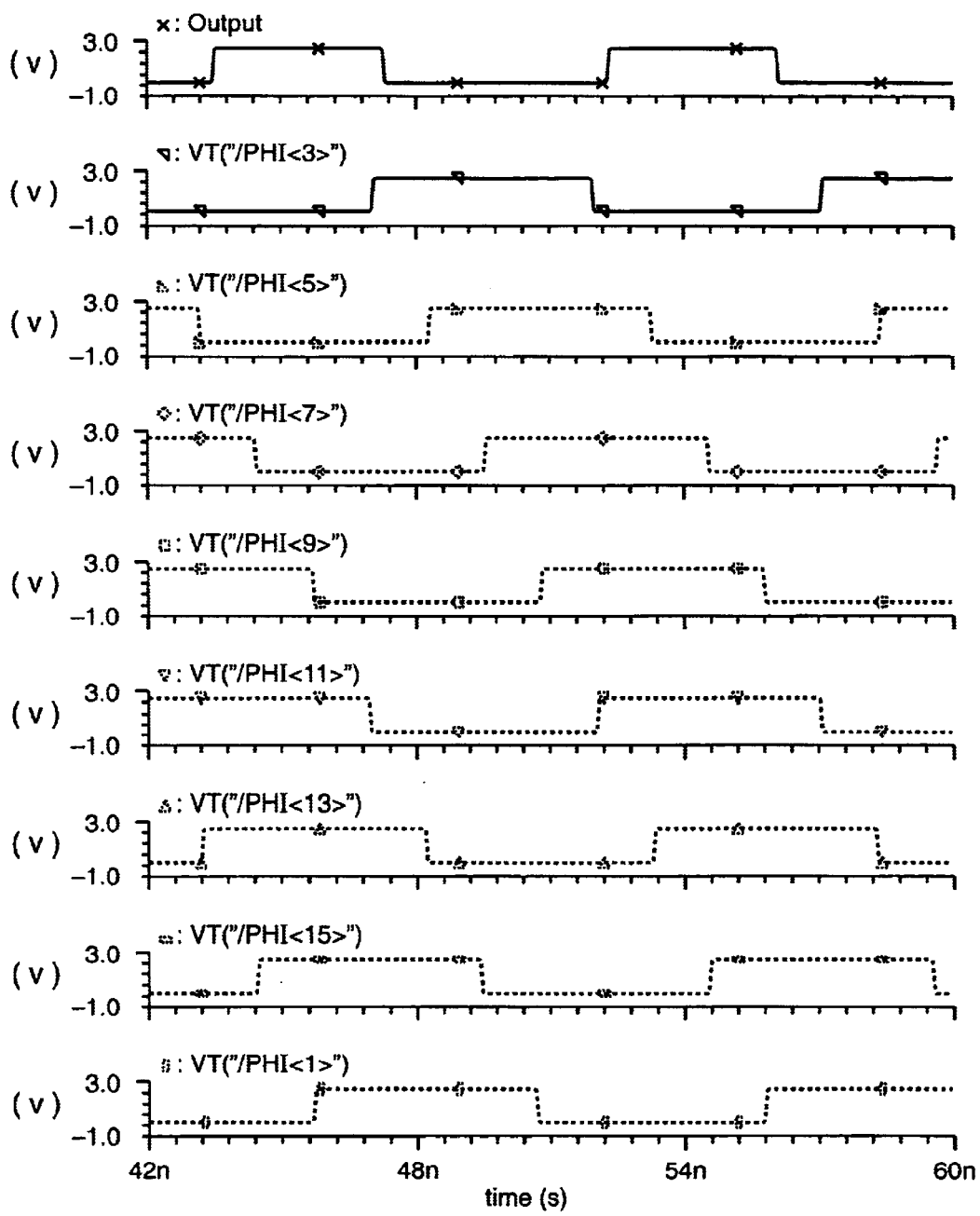
FIG._8

PHASE MIXER

CROSS REFERENCE TO RELATED APPLICATIONS

This application claims priority from Provisional Application Serial No. 60/129,697, filed Apr. 16, 1999.

BACKGROUND OF THE INVENTION

The present invention relates to clock synchronization and, particularly, to an improved system and method for locking a signal onto a non-integer multiple of a reference frequency signal.

A phase locked loop (PLL) circuit generates a frequency which is an integer multiple of a reference frequency, usually a stable source such as a crystal oscillator. However, certain applications require a stable signal source which is a non-integer multiple of a stable reference source.

SUMMARY OF THE INVENTION

A phase mixer according to the present invention is provided which generates non-integer multiples of a stable reference source. Briefly, the phase mixer according to one embodiment includes a recirculating shift register and a multiplexer. The shift register output addresses the multiplexer, and the multiplexer in turn selects as the output one of the phases of the reference oscillator. The output of the multiplexer is used to clock the shift register. Because the reference oscillator phases are themselves shifted with reference to one another, sequential selection of the phase pulses as output pulses results in an output which is a non-integer multiple of the reference oscillator frequency.

BRIEF DESCRIPTION OF THE DRAWINGS

These and other aspects of the invention are readily understood with reference to the following specification and attached drawings in which:

FIG. 1 is a block diagram of phase locked loop employing a phase mixer in accordance with an embodiment of the invention;

FIG. 2 is a diagram illustrating a 16/15 phase mixer according to an embodiment of the invention;

FIG. 3 is a diagram illustrating the phase mixer of FIG. 2 in greater detail;

FIG. 4 is a timing diagram illustrating timing for the phase mixer of FIG. 2;

FIG. 5 is a diagram illustrating a 16/17 phase mix according to an embodiment of the invention;

FIG. 6 is a timing diagram of the phase mixer of FIG. 5;

FIG. 7 is a diagram illustrating a 16/14 phase mixer according to an embodiment of the invention; and FIG. 8 is a timing diagram for the phase mixer of FIG. 7.

DETAILED DESCRIPTION OF THE INVENTION

FIGS. 1–8 illustrate a phase mixer system and method according to the present invention. The phase mixer provides a system and method for locking a signal onto a non-integer multiple of a reference signal.

Turning now to the drawings and, with particular attention to FIG. 1, a general block diagram of an exemplary phase locked loop (PLL) employing a phase mixer according to the present invention is shown. The PLL 100 may include a phase comparator 102, a charge pump 104, a low pass filter 105, and a ring oscillator 112. An integer divider or a phase mixer (fractional divider) 114 may be interposed in the feedback loop between the ring oscillator 112 and the phase comparator 102. A phase mixer 107 may also be provided at the output of the ring oscillator 112. The phase mixer 107 includes an initialization circuit 106, and a phase shift selection circuit which may include a shift register 108 and a multiplexer 110.

As will be discussed in greater detail below, the initialization circuit 106 initializes the shift register 108 by providing a walking one (1) pattern upon initialization. The shift register 108's output addresses the multiplexer 110, and the multiplexer 110 in turn selects one of the phases of the reference oscillator 112. The output of the multiplexer 110 (i.e., the sequence of phases) is further used to clock the shift register 108, as well as provide the system output. The output of the multiplexer 110 is a frequency which is different from the reference oscillator frequency 112 by the ratio represented by Equation 1 below:

$$f_{out} = f_{in} \times \frac{N}{N \pm M} \qquad \text{Equation 1}$$

where N is the integer number of phases of the reference oscillator; and

M is an integer less than N, such that M<N.

As will be discussed in greater detail below, assuming PH(k) leads in phase compared to PH(k+1) for k=0 to k=n−1, the "−" operator in Equation 1 above holds true when the phases are selected in descending order. The "+" operator holds true when phases are selected in ascending order.

Turning now to FIG. 2, an exemplary phase mixer 107a according to an embodiment of the invention is illustrated in greater detail. In particular, in the embodiment shown, N=16 and M=1 and the phases are selected in descending order. Thus, the phase mixer 107a of FIG. 2 is a 16/15 ratio phase mixer and the output of the multiplexer 110a is 16/15 times the reference oscillator frequency. As shown, in FIG. 2 the multiplexer 110a is a 16-to-1 multiplexer, embodied as a plurality of three-statable inverters 200-0 to 200-15. The inputs of the respective three-statable inverters 200-0 to 200-15 are the phases PH0–PH15 from the reference oscillator 112 (FIG. 1). The outputs of the three-statable inverters are tied together and provided as system output and to clock the shift register 108a. The shift register 108a selectively enables the individual inverters 200-0 through 200-15, as will be discussed in greater detail below.

In the embodiment illustrated, the shift register 108a is a recirculating shift register. The shift register 108a is embodied as plural D flip-flops 202-0 through 202-15. The flip-flops 202-0 through 202-15 are clocked by the output of the multiplexer 110a, i.e., by the selected one of the three-statable inverters 200-0 through 200-15. The outputs of the individual flip-flops 202-0 through 202-15 are the multiplexer 110a select lines, i.e., the outputs of the individual flip-flops 202-0 through 202-15 are provided to the enable lines of the three-statable inverters 200-0 through 200-15, respectively.

Thus, a particular inverter 200-0 through 200-15 is enabled, which causes selection of the corresponding phase output pulse, PH0–PH15, respectively. For example, FIG. 4 is a timing diagram illustrating system output 400 and even phases (i.e., PH0, PH2, . . . PH4). Each phase is shifted with reference to each other by a predetermined shift, As noted above, the shift register 108a shifts a walking one (1) pattern based on its clocking. Suppose, for example, the output of the D flip-flop 202-6 was one (1). The inverter 200-6 is enabled to select PH6 (FIG. 4) as the mixer output. The pulse PH6 also clocks the shift register, causing the one (1) at the output of the D flip-flop 202-6 to propagate to the D flip-flop 202-5. This, in turn, enables the inverter 200-5 to select PH5 (not shown). The pulse PH5 appears at the phase mixer output and clocks the shift register to shift again. The process continues, with PH4, PH3, and so on, being successively enabled and contributing to the output.

As noted above, the initialization circuit 106a provides an initial clocking input to the shift register 108a and an initial enable. Thus, upon reset, a one (1) is shifted into the shift register 108a. In particular, one embodiment of the initialization circuit 106a is shown in greater detail in FIG. 3. As shown, the initialization circuit 106a includes an SR flip-flop 302, a pair of cascaded D flip-flops 304, 306, an inverting delay chain 307, and a NOR gate 308. The SR flip-flop 302 is embodied as a NAND gate 312 and a NAND gate 314. An active low RESET signal is provided to the SET input of the SR flip-flop 302 and also to the RESET control inputs of the D flip-flops 304, 306. The clock inputs of the D flip-flops 304, 306 are coupled to the clock inputs of the counter. The inputs to the NOR gate 308 are the output of the SR flip-flop 302 and the D flip-flop 304. The output of the NOR gate 308 is provided to the RESET inputs of the counter flip-flops, except the flip-flop 202-1, where it is provided to the SET input, as will be explained in greater detail below. Finally, the output of the D flip-flop 306 is provided to the inverting delay chain 307, the output of which, in turn, is provided to the R input of the SR flip-flop 302.

When the RESET input RST of the initialization circuit is low, the RESET inputs (RN) of the D flip-flops 304, 306 are active, which provides a zero (0) at their outputs. The output of the SR flip-flop 302 is one (1), which causes the output of the NOR gate 308 to be zero (0). This causes the SET input of the D flip-flop 202-1 of the counter to go active and output a one (1). All the other D flip-flops in the counter are cleared, and output a zero (0). This, in turn, causes the multiplexer to output at the inverter 200-1. The output of the multiplexer clocks the counter, and the one (1) is propagated through the counter. At reset state, the phase PH1 is selected through the multiplexer 110a. When the input RST of the initialization circuit 106a makes a low to high transition, reset is removed from the RS latch 302 and also from the two flip-flops 304, 306, but the shift register flip-flops remain in reset. The next positive edge of PH1 clocks a one (1) into the flip-flop 304 and the second rising edge of Phi clocks the one (1) into the flip-flop 306, at which time the reset of the shift register flip-flops is also removed.

FIG. 5 illustrates another similar embodiment of phase mixer and, particularly, a 16/17 frequency ratio phase mixer. Thus, in the phase mixer of FIG. 5, N=16 and M=1 and the phases are selected in ascending order. The phase mixer 107b of FIG. 5 includes an initialization circuit 106b, a shift register 108b and a multiplexer 110b. The phase mixer 107b of FIG. 5 is generally similar to the phase mixer 107a of FIG. 2, except that order of selection of the phases is reversed. Thus, the shift register includes D flip-flops 502-0 through 502-15, which enable or select the phases of input to the multiplexer 110b, in order PH1–PH15, in a manner similar to that described above. FIG. 6 illustrates a timing diagram of the phase mixer of FIG. 5. As can be seen, it is generally similar to the timing for the phase mixer of FIGS. 2 and 3.

FIG. 7 illustrates another embodiment of a phase mixer according to the present invention. In particular, the phase mixer 107b of FIG. 7 is a 16/14 ratio phase mixer. That is, N=16 and M=2 and the phases are selected in a descending order. The phase mixer 107b includes an initialization circuit 106c, a multiplexer 110c and a shift register 108c. The initialization circuit 106c is generally similar to the initialization circuit 106a of FIG. 3, and includes an SR flip-flop 302b including NAND gates 312b, 314b. The initialization circuit 106c further includes D flip-flops 304b, 306b, and a NOR gate 308b, which provides the initialization output to the shift register 108c.

In this case, every other phase is selected. Thus, the shift register 108c includes D flip-flops 702-1, 702-3, 702-5, 702-7, 702-9, 702-11, 702-13, and 703-15 The D flip-flops selectively enable the three-statable inverters 700-1, 700-3, 700-5, 700-7, 700-9, 700-11, 700-13, and 700-15, as shown in the timing diagram of FIG. 8.

What is claimed is:

1. A phase mixer circuit comprising:
   means for sequentially selecting a plurality of phases; and
   means coupled to said selecting means for choosing when one of said plurality of phases is selected,
   wherein said one of plurality of phases is chosen such that an output frequency to an input frequency of said phase mixer has a frequency ratio of (N/N±M), where N is an integer number of phases and M is an integer less than N.

2. A phase mixer according to claim 1, wherein said frequency ratio is $$\left(\frac{N}{N+M}\right).$$

3. A phase mixer according to claim 1, wherein said frequency ratio is $$\left(\frac{N}{N-M}\right).$$

4. A phase mixer according to claim 1, including means for initializing said choosing means.

5. A phase mixer according to claim 4, said sequentially selecting means comprising a single output multiplexer.

6. A phase mixer according to claim 5, said choosing means comprising a shift register.

7. A phase mixer according to claim 6, said initializing means configured to initialize a walking one pattern through said shift register.

* * * * *

UNITED STATES PATENT AND TRADEMARK OFFICE
CERTIFICATE OF CORRECTION

PATENT NO. : 6,661,863 B1
DATED : December 9, 2003
INVENTOR(S) : Zabih Toosky

It is certified that error appears in the above-identified patent and that said Letters Patent is hereby corrected as shown below:

Column 4,
Line 32, replace "(N/N±M)" with -- $\dfrac{N}{N \pm M}$ --.

Signed and Sealed this

Twenty-seventh Day of July, 2004

JON W. DUDAS
*Acting Director of the United States Patent and Trademark Office*